(12) United States Patent
Trimmel et al.

(10) Patent No.: US 6,181,758 B1
(45) Date of Patent: Jan. 30, 2001

(54) PHASE-LOCKED LOOP WITH SMALL PHASE ERROR

(75) Inventors: Herwig Trimmel, Puchheim; Gerhard Thanhaeuser, Mering; Baldur Stummer, Munich, all of (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/507,988

(22) Filed: Feb. 18, 2000

(30) Foreign Application Priority Data

Feb. 23, 1999 (DE) .............................. 199 07 756

(51) Int. Cl.⁷ .................................................. H03D 3/24
(52) U.S. Cl. ............................................. 375/376; 327/147
(58) Field of Search ................................ 375/376, 375, 375/340, 324, 294; 331/1 A; 327/147, 249, 156

(56) References Cited

U.S. PATENT DOCUMENTS

| | | | |
|---|---|---|---|
| 5,056,116 | * 10/1991 | Shimada et al. | ...................... 375/324 |
| 5,373,255 | 12/1994 | Bray et al. . | |
| 5,828,255 | 10/1998 | Kelkar et al. . | |
| 5,920,533 | * 7/1999 | Honma | ................................... 369/59 |

FOREIGN PATENT DOCUMENTS 3-253116    12/1991   (JP) .

OTHER PUBLICATIONS

"Optimization Techniques For High Order Phase Locked Loop type Jitter Reduction Circuit For digital Audio" Wong, IEEE pp. 156–163, 1996.*

* cited by examiner

Primary Examiner—Temesghen Ghebretinsae
(74) Attorney, Agent, or Firm—Schiff Hardin & Waite

(57) ABSTRACT

A phase-locked loop for controlling the phase of an output signal S2 dependent on a reference signal S1 with only a small phase timing error has a sampling circuit for sampling the reference signal S1 with the output signal S2 and for generating a sampling signal S1A, a jitter modulation circuit (3) for generating a sampling signal S1AJ delayed by a defined time duration and for alternating output of the undelayed sampling signal S1A and the delayed sampling signal S1AJ, a phase detector for acquiring an average phase difference between the output signal S2 and the delayed and undelayed sampling signals S1A and S1AJ, and a controllable oscillator for generating the output signal S2 with a frequency that is controllable dependent on the average phase difference acquired by the phase detector.

12 Claims, 5 Drawing Sheets

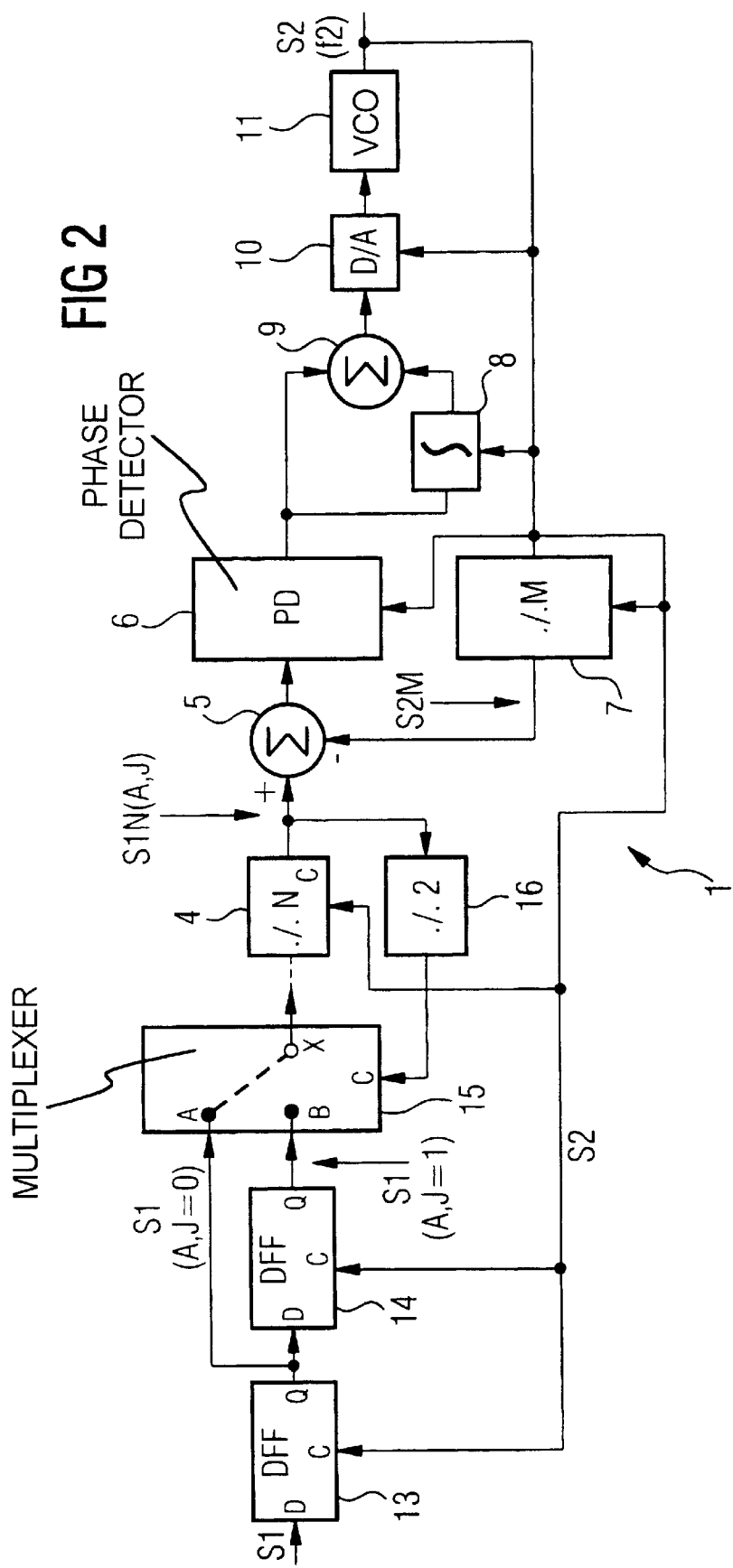

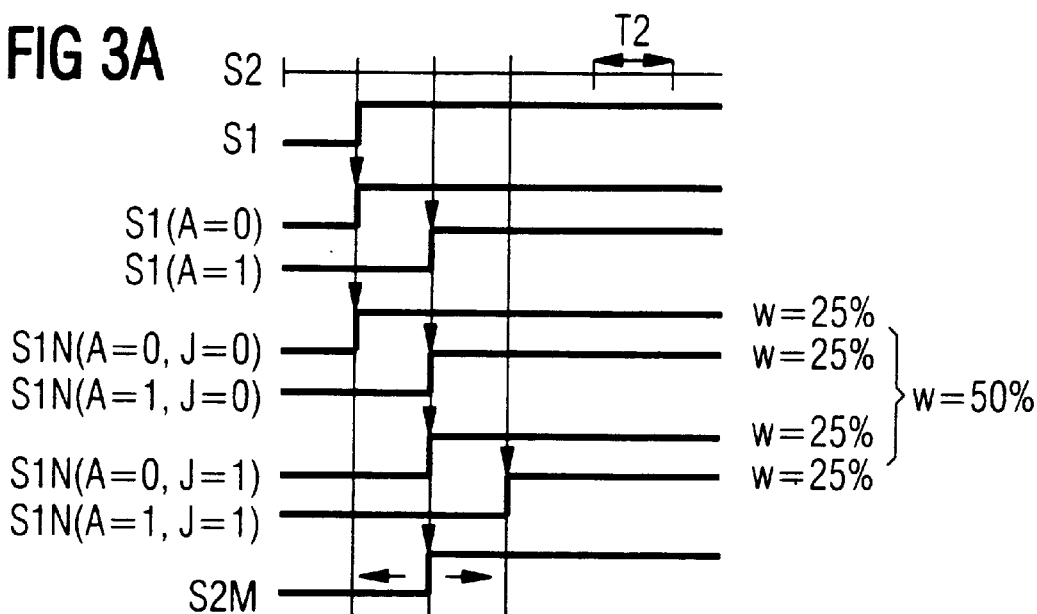
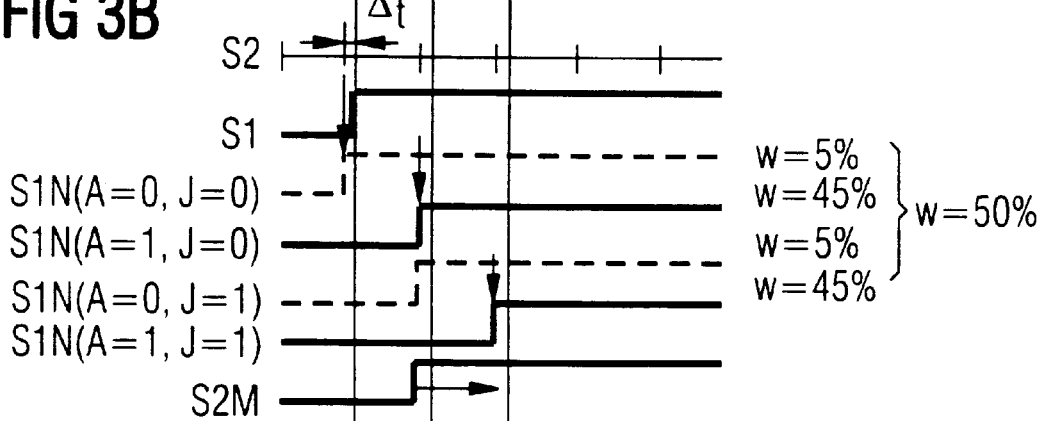
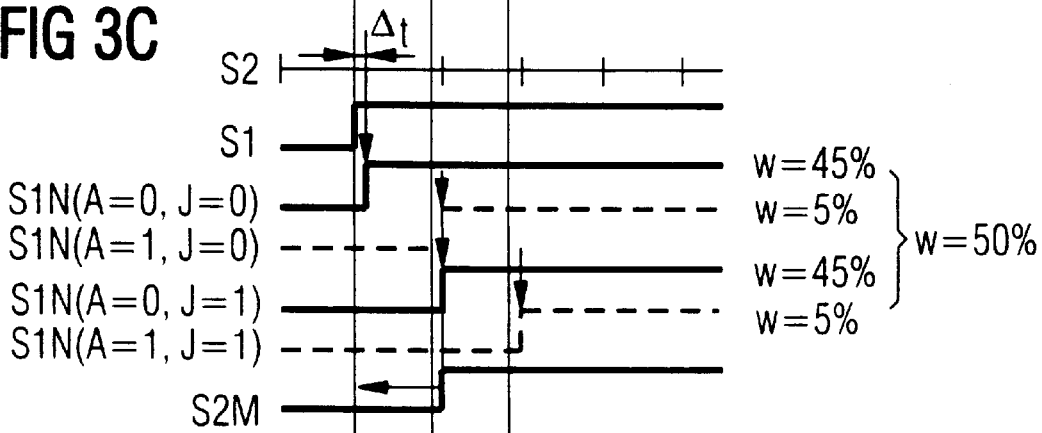

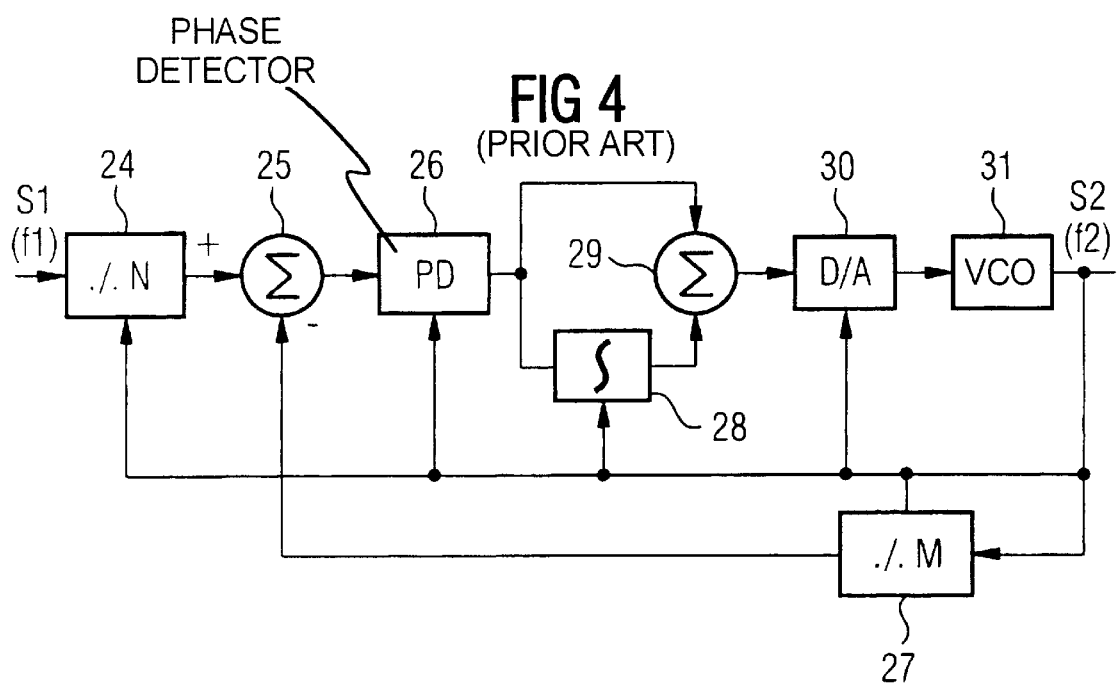
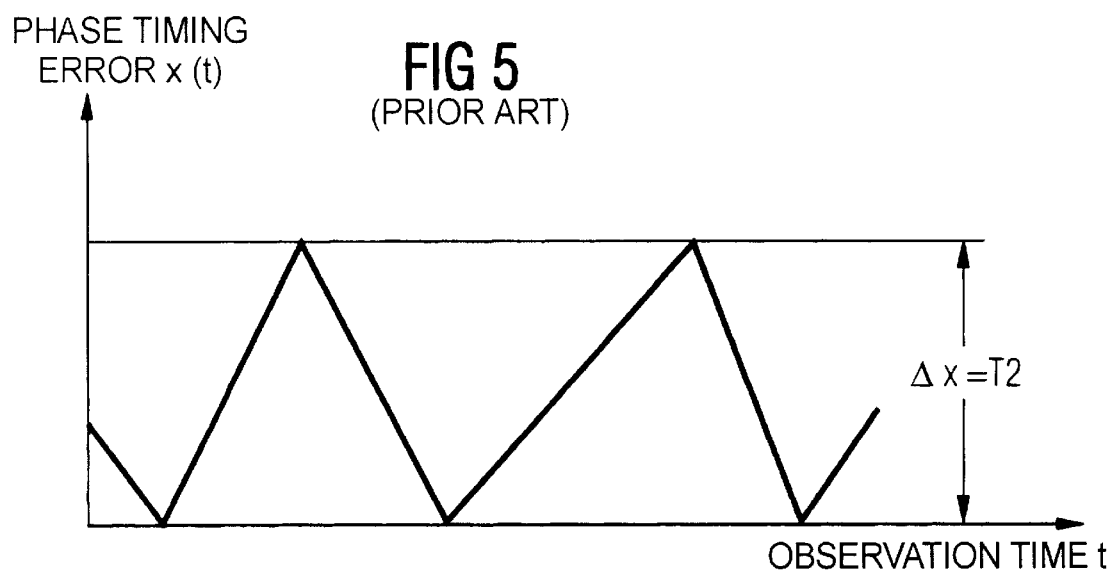

t = t0:

t = t1:

t = t2:

PHASE-LOCKED LOOP WITH SMALL PHASE ERROR

BACKGROUND OF THE INVENTION

1. Field of the Invention

The present invention is directed to a phase-locked loop for controlling the phase of an output signal S2 dependent on a reference signal S1.

2. Description of the Prior Art

FIG. 4 shows a block circuit diagram of a known, digital phase-locked loop (PLL) of the above type. By comparison in a phase detector 26, the phase position of the output signal S2 having the frequency f2 is regulated to the phase of the reference signal S1 having the frequency f2. The follow-up of the output signal S2, however, is not error-free. The phase timing error x(t), i.e. the phase difference between the reference signal S1 and the output signal S2, is established in digital phase-locked loops by the cycle duration or quantization stage T2=1/f2 of the output signal, which, as indicated in FIG. 4 by arrow lines, is also employed as the clock frequency for the digital components such as the dividers 24, 27, the phase detector 26 of the integrator 28 and the digital-to-analog converter 30.

The reason why a phase timing error arises in the phase-locked loop shown in FIG. 4 is explained below on the basis of FIGS. 5, 6A, 6B and 6C.

The phase positions of the signals S2, S2M (output signal at the input of the phase detector divided by M) and S2N (reference signal at the input of the phase detector divided by N) relative to the reference signal S1 are shown at different, successive times t0 (FIG. 6A), t1 (FIG. 6B) and t2 (FIG. 6C). A slighter higher eigenfrequency (leading phase position) of the crystal oscillator 31 is assumed. The (higher-frequency) signal S2 samples the phase of the reference signal S1 with a cycle T2=1/f2 (symbolized in FIGS. 6A through 6C by a vertical arrow). When the phase shift of the signals S1 and S2 relative to one another exceeds the cycle duration T2, then this is acquired by the phase detector 26 and the voltage-controlled oscillator 31 is controlled with the integrator 28, the summing circuit 29 and the digital-to-analog converter 30, to correspondingly re-adjust the frequency of the signal, so that the phase shift between S1 and S2 is minimized. Within the cycle duration, however, the linking of the signals S1N, S2M and S2—which are synchronous relative to one another—to the reference signal S1 is cancelled. This dead time fundamentally arises due to the sampling of the reference signal S1 by the oscillator signal S2. Any drift of the oscillator 31 will not re-adjusted in this way during the dead time T2 and thus fully affects the output signal S2. The phase difference is acquired by the phase detector 26 only given a phase timing error x=T2, and the frequency of the oscillator 31 is correspondingly readjusted. A time-dependent phase timing error x(t) having a maximum value Δx=T2 thus occurs, the typical time curve thereof being shown in FIG. 5. One can recognize a typical delta or sawtooth-shaped curve that is first defined in the leading direction by the drift of the oscillator. When the error x(t) reaches the threshold T2, a lower locking voltage that reduces the frequency of the oscillator 31 is generated. The error x(t) then in turn becomes smaller until the phase detector 26 no longer acquires a phase difference, and the locking voltage at the oscillator subsequently disappears.

FIG. 6B shows the situation when a phase timing error $0 \leq x \leq T2$ exists between the signal S1 and the signals S2, S1N and S1M, which are synchronous relative to one another. When the phase timing error continues to increase until x=T2 has been reached (FIG. 6C), the sampling by the signal S2 acquires the changed phase position, and the oscillator is correspondingly re-adjusted.

An optimally small phase timing error is advantageous for specific applications such as, for instance, clock editing circuits in synchronous digital communication networks.

It is known to reduce the phase timing error x(t) by employing high-frequency, re-adjusted, controllable oscillators and to thus achieve a high frequency of the signal S2. This method, however, has the disadvantage that the operating range of a voltage-controlled crystal oscillator (VCXO) decreases with the square of the harmonic of the crystal oscillator that is employed, i.e., the range of control of the oscillator frequency becomes smaller as the operating frequency of the crystal oscillator becomes higher relative to the fundamental oscillation thereof. For output signals of higher frequency S2, moreover, the digital components of the phase-locked loop must be realized with fast logic circuits, causing an increase in cost and power consumption. Due to the high number of synchronously clocked flip-flops in counters and dividers, the operating frequency is considerably lower than the limit frequency of, for example, a flip-flop. In one example with 500 synchronous flip-flops, an operating frequency of only 50 MHZ could be achieved with 0.5 μm CMOS technology, corresponding to a phase timing error of approximately 20 ns.

SUMMARY OF THE INVENTION

An object of the present invention is to provide a phase-locked loop having only a small phase error. object is inventively achieved in a phase-locked loop having a sampling circuit for sampling the reference signal S1 with the output signal S2 and for generating a sampling signal S1A, a jitter modulation circuit for generating a sampling signal S1AJ delayed by a defined time duration and for alternating output of the undelayed sampling signal S1A and the delayed sampling signal S1AJ, a phase detector for acquiring an average phase difference between the output signal S2 and the delayed and undelayed sampling signals S1A and S1AJ, and a controllable oscillator for generating the output signal S2 having a frequency that is controllable dependent on the average phase difference acquired by the phase detector. Due to the averaging, phase shifts between the reference signal S1 and the output signal S2 that lie within a sampling period of the Signal S2 can be "noticed" by the phase detector. The phase timing error thus can be significantly reduced.

The jitter modulation circuit preferably has a delay circuit such as, for example, a D flip-flop for generating the delayed reference signal S1AJ and a switching stage for alternating delivery of the delayed signal S1AJ and the undelayed signal S1A to the phase detector. The switching stage preferably is a digital multiplexer.

The signal delay generated by the delay circuit preferably corresponds to a cycle duration T2 of the output signal S2.

The switching frequency of the switching stage is selected high in relationship to the transfer function of the phase-locked loop, so that the switch signal of the switching stage is largely suppressed in the output signal, so that no disturbances caused by the jitter modulation appear in the output signal.

The inventive phase-locked loop can have a first frequency divider for frequency-division of the reference signal S1 by N before delivery to the phase detector and a second frequency divider for frequency-division of the output signal S2 by M before delivery to the phase detector. Signals S1, S2 of different frequencies thus can be brought into a fixed phase relationship with the phase-locked loop.

The switching cycle of the switching stage preferably amounts to 2N times the clock period t2 of the output signal S2.

In order to facilitate a symmetrical phase fine-control, the pulse-duty factor of the undelayed signal S1A generated by the switching stage and the pulse-duty factor of the delayed signal S1AJ preferably are 1:1.

The inventive circuit is preferably realized with purely digital components, thereby achieving a dependable fine phase control is enabled with a low number of gates.

DESCRIPTION OF THE DRAWINGS

FIG. 2 is a block circuit diagram of a modified exemplary embodiment of the inventive phase-locked loop.

FIGS. 3A, 3B and 3C show signal-time flowcharts for explaining the functioning of the phase-locked loop of FIG. 1 or 2.

FIG. 4, as noted above, is a block circuit diagram of a known phase-locked loop.

FIG. 5, as noted above, is a diagram for explaining how a phase timing error arises in the phase-locked loop of FIG. 4.

DESCRIPTION OF THE PREFERRED EMBODIMENTS

Figure 1:
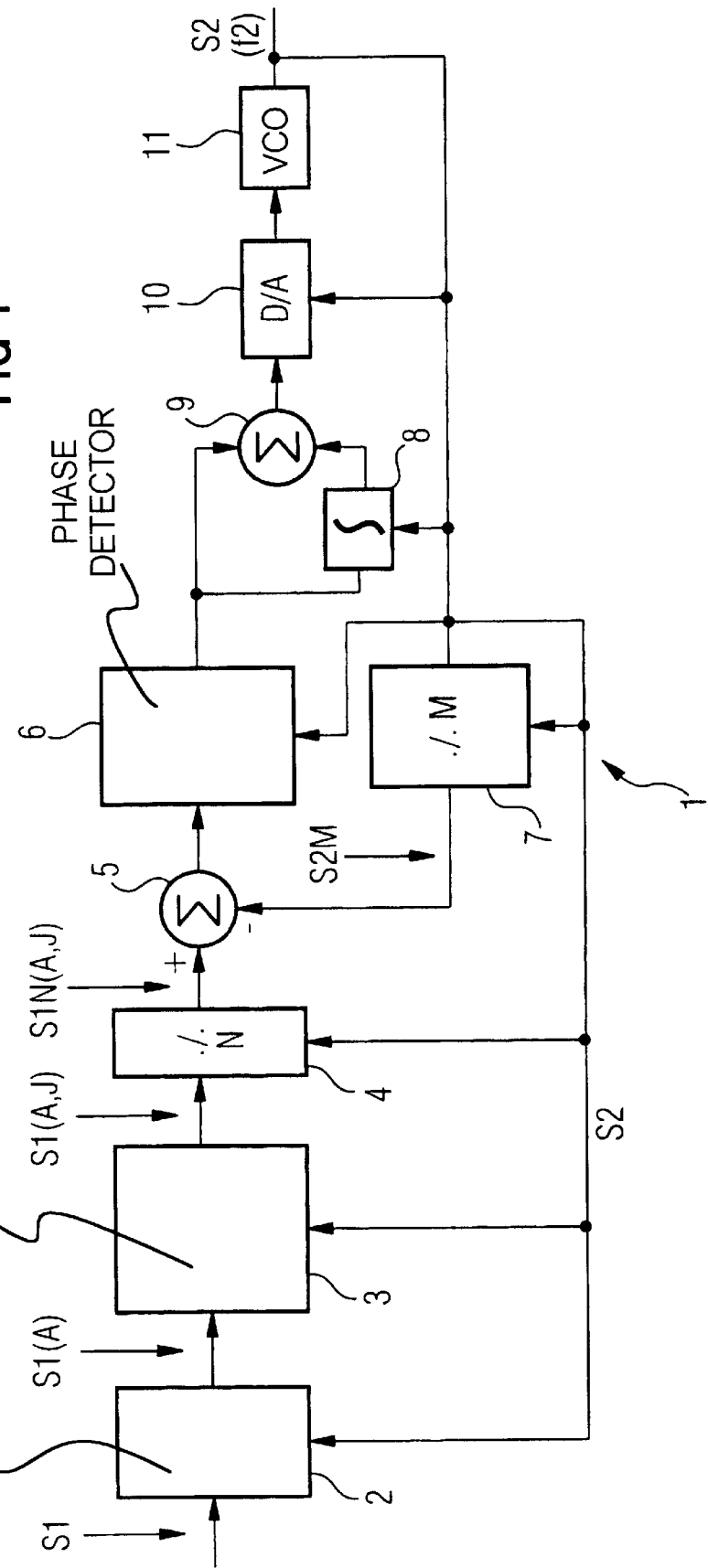
FIG. 1 is a block circuit diagram of a first exemplary embodiment of the inventive phase-locked loop.
Figure 6A:
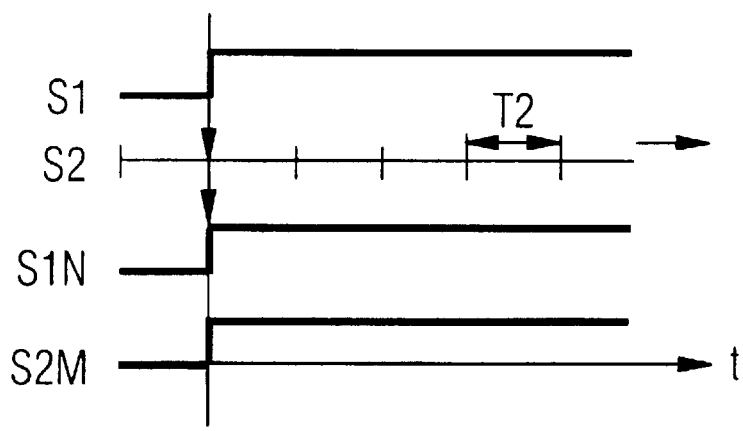
FIGS. 6A, 6B and 6C, as noted above, show a signal-time flowchart for explaining how a phase timing error arises in the phase-locked loop of FIG. 4.
Figure 6B:
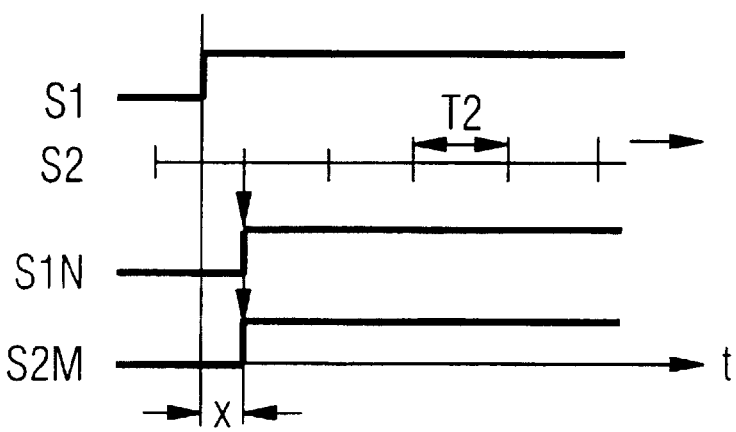
Figure 6C:
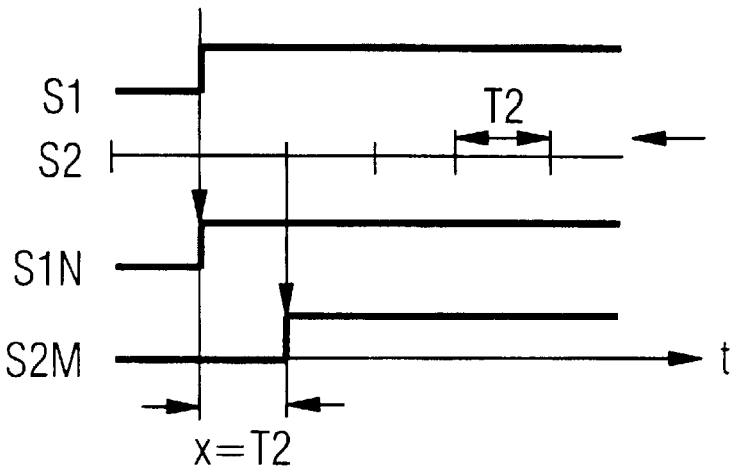

FIG. 1 is a block circuit diagram of an inventive phase-locked loop. The components in the right side of the circuit, i.e. the divider 4, the adder 5, the phase detector 6, the divider 7, the integrator 8, the adder 9, the digital-to-analog converter 10 and the voltage-controlled oscillator 11 correspond to the respective components of the circuit of FIG. 4. Before the signal S1 is divided by N in the divider 4, it is sampled in a sampling circuit 2 driven by the signal S2 and is subsequently modulated by the jitter modulation circuit 3. The modulated signal A1 (A, J) is divided by N, and the signal S1N (A, J) resulting therefrom is supplied to the adder 5, to which the output signal S2 divided by M is also supplied. The phase detector 6, which is likewise clocked by the signal S2, acquires the phase difference between the signals S1N (A, J) and S2M, and, via the integrator 8, the adder 9 and the digital-to-analog converter 10, correspondingly controls the voltage-controlled oscillator 11 to minimize the acquired phase difference.

The functioning of the jitter modulation circuit 3 is explained below with reference to FIG. 3. FIG. 3A shows the phase positions in the stationary condition, i.e. when S1 and S2 are in phase. The positive edge of the output signal S2 is regulated to the positive edge of the reference signal S1. The sampling of S1 ensues with the clock signal S2. Since the edges of S1 and S2 coincide, the sampling circuit 2 generates, in alternation, a non-delayed signal S1 (A=0) when the clock edge lies shortly after the signal edge S1, and a signal S1 (A=1) delayed by T2 when the clock edge S2 lies shortly before the signal edge S1. In the equilibrium state, the sampling circuit 2 thus samples the signal S1 shortly before the signal edge on one occasion and shortly after the signal edge on another occasion, so that the undelayed signal S1 (A=0) and the signal S1 (A=1) respectively occur with 50% probability.

With a 50% pulse-duty factor in each case, the jitter modulation circuit 3 generates the signals S1 (A, J=0) and S1 (A, J=1) from the signal S1A. For J=1, the duration of a clock period T2 is added, whereas no delay is produced given J=0. The switching period kT2 is preferably selected at k=2N such that both cases follow one another in alternation after the input divisor N. Three phase positions thus are contained in the signal S1 (A, J) supplied to the divider N:

edge t=0: S1(A=0, J=0), w=25%
edge t=T2: S1(A=0, J=1), w=25%
  S1(A=1, J=0), w=25%
edge t=2T2: S1(A=1, J=1), w=25%.

The signal S1N (A, J) frequency-divided by N is then generated from the signal S1 (A, J) with the synchronous divider 4. By comparison to the output signal S2M frequency-divided by M, a control voltage for the oscillator 11 that is proportional to the average phase difference is generated at the phase detector. For the equilibrium state, S2m is regulated to the average value t=T2. The two limit cases t=0 and t=2T2 generate control voltages of opposite polarity that mutually cancel on average, so that the frequency of the voltage-controlled oscillator 11 remains constant. The jitter frequency is selected higher than the limit frequency of the jitter transfer function of the phase-locked loop, so that the jitter signals are suppressed in the output signal S2. The derivation of the jitter frequency preferably ensues from the oscillator signal S2 or from the reference signal S1N at the input of the phase detector 6.

FIG. 3B shows the case of the leading phase position of the signal S2 compared to S1. The signal S1 (A=1) then arises more often (for example, at 90%) than the signal S1 (A=0) shown with broken lines since the sampling of S1 by S2 ensues more often at "0' before the leading signal edge than at "1" after the signal edge. After jitter modulation by the jitter modulation circuit 3, the signal S1 (A, J) contains the 3 phase positions t=0 with 5% probability, t=T2 with 50% probability and t=2T2 with 45% probability. The phase detector, which generates a control voltage proportional to the average phase difference, therefore will output a locking voltage to the voltage-controlled oscillator 11 that reduces the leading phase position of S2 and brings this signal to the edge of S1 until the equilibrium state shown in FIG. 3A is again achieved. Phase timing errors that are significantly less than the cycle T2 of the sampling signal S2 thus can be acquired and minimized with the inventive phase-locked loop. The remaining phase timing error is determined by the switch edges of the jitter modulation. A phase timing error that lies at 10% or less of the cycle duration T2 of the signal S2 thus can be achieved.

FIG. 3C shows the case of the trailing phase position of the signal S2 compared to the signal S1. Here, the sampling ensues more often after the leading edge of S1, so that the signal S1 (A=0) arises more often than S1 (A=1). Analogous to the case discussed in FIG. 3B, the phase detector generates a control voltage on average that raises the frequency of the oscillator and thus reduces the trailing phase position of S2 and brings it to the edge of the signal S1.

FIG. 2 shows a modified exemplary embodiment of the phase-locked loop of FIG. 1. The sampling circuit 2 is realized by a first D flip-flop 13 whose C-input is supplied with the signal S2. A second D flip-flop that generates a signal delay by T2 is connected to the output of the D flip-flop 13. The output of the first flip-flop 13 is connected to a first input of a multiplexer 15, and the output of the second flip-flop is connected to a second input B of the multiplexer 15. The multiplexer 15 serves as a switch in order to switch in alternation between the non-delayed signal S1 (A, J=0) and the delayed signal S1 (A, J=1). The switching frequency fj=f1/2N is derived from the signal S1N, so that only one frequency divider 16 is now required, this dividing the frequency of the signal S1 N by 2.

It is clear from FIG. 2 that the outlay of digital logic circuits for realizing an inventive jitter modulator is extremely low; only one multiplexer and two D flip-flops are required. The remaining phase timing error in this embodiment corresponds to the setup and hold time of the two D flip-flops 13 and 14.

Although modifications and changes may be suggested by those skilled in the art, it is the intention of the inventors to embody within the patent warranted hereon all changes and modifications as reasonably and properly come within the scope of their contribution to the art.

We claim as our invention:

1. A phase-locked loop for controlling a phase of an output signal dependent on a reference signal, comprising:
   a sampling circuit for sampling said reference signal with said output signal, and thereby generating a sampled signal;
   a jitter modulation circuit supplied with said sampled signal and generating a delayed sampled signal therefrom, which is delayed by a defined time duration relative to said sampled signal, and for alternatingly emitting said sampled signal and said delayed sampled signal as outputs;
   a phase detector supplied with said sampled signal and said delayed sampled signal and with said output signal, for identifying an average phase difference between said output signal and said delayed sampling signal and said sampling signal; and
   a controllable oscillator supplied with a signal representing said average phase difference for generating said output signal at a frequency dependent on said average phase difference.

2. A phase-locked loop as claimed in claim 1 wherein said jitter modulation circuit comprises a delay circuit for generating said delayed sampled signal, and a switching stage for alternatingly supplying said sampled signal and said delayed sampled signal to said phase detector.

3. A phase-locked loop as claimed in claim 2 wherein said switching stage comprises a digital multiplexer.

4. A phase-locked loop as claimed in claim 2 wherein said output signal has a cycle duration, and wherein said delay circuit delays said sampled signal to produce said delayed sampled signal by said cycle duration.

5. A phase-locked loop as claimed in claim 2 wherein said sampling circuit, said jitter modulation circuit, said phase detector and said controllable oscillator in combination have a transfer function associated therewith, and wherein said switching stage is operated by switching signal at a switching frequency which is high relative to said transfer function so that said switching signal is substantially suppressed in said output signal.

6. A phase-locked loop as claimed in claim 1 further comprising a frequency divider, preceding said phase detector, for dividing said reference signal by N wherein N>1.

7. A phase-locked loop as claimed in claim 6 comprising a further frequency divider preceding said phase detector for dividing said reference signal by M, wherein M>1.

8. A phase-locked loop as claimed in claim 6 wherein said jitter modulation circuit comprises a delay circuit for generating said delayed sampled signal, and a switching stage for alternatingly supplying said sampled signal and said delayed sampled signal to said phase detector and wherein said output signal has a cycle duration and wherein said switching stage operates at a switching frequency having a switching period which is 2N times said cycle duration.

9. A phase-locked loop as claimed in claim 2 wherein said delay circuit comprises a D flip-flop driven by said output signal.

10. A phase-locked loop as claimed in claim 1 wherein said sampling circuit comprises a D flip-flop.

11. A phase-locked loop as claimed in claim 1 wherein said sampled signal and said delayed sampled signal have respective pulse-duty factors associated therewith, said pulse-duty factors having a ration of 1:1.

12. A phase-locked loop as claimed in claim 1 wherein said controllable oscillator comprises a voltage-controlled crystal oscillator.

* * * * *